United States Patent [19]
Peoples

[11] 4,326,261
[45] Apr. 20, 1982

[54] SINGLE TONE DETECTOR

[76] Inventor: John T. Peoples, 20 Dorset Rd., Berkeley Heights, N.J. 07922

[21] Appl. No.: 162,260

[22] Filed: Jun. 23, 1980

[51] Int. Cl.³ .......................................... G01R 23/14
[52] U.S. Cl. ................................................. 364/724
[58] Field of Search ................... 364/724, 825, 572; 328/167

[56] References Cited

U.S. PATENT DOCUMENTS 4,021,653  5/1977  Sharp et al. ......................... 364/724
4,216,463  8/1980  Backof, Jr. et al. ............. 340/171 R

OTHER PUBLICATIONS

Cappellini "Digital Filtering with Sampled Signal Spectrum Frequency Shift", *Proceedings of the IEEE*, Feb. 1969, pp. 241-242.
Capellini et al., "A Special-Purpose On-Line Processor for Bandpass Analysis", *IEEE Trans. on Audio & Electroacoustics*, Jun. 1970, pp. 188-194.

*Primary Examiner*—David H. Malzahn
*Attorney, Agent, or Firm*—R. O. Nimtz

[57] ABSTRACT

Circuitry for detecting and estimating the frequency of a tone signal comprises: sampler (20) to discretize the tone signal into samples; discrete-time filter means (21) for processing the samples; control means (30) including oscillator (31) for driving the sampler and clock generating means (32, 33 and 34) for developing a set of clocking signals to sequentially drive the filter means, this set comprising the frequency of the oscillator and preselected submultiples thereof; threshold signal (24) indicative of the strength of the tone signal; comparator (22) for providing a resultant indication of the comparison between the threshold signal and the output of the filter means; and decoder (23) for converting the set of resultant indications obtained sequentially during each clock signal to yield the output estimate. Thus, the circuitry relies on the use of a single discrete-time filter initially driven by a filter that is successively expanded in correspondence to a clock which is successively decimated.

10 Claims, 6 Drawing Figures

SINGLE TONE DETECTOR

BACKGROUND OF THE INVENTION

1. Field of the Invention

This invention relates generally to spectrum analysis and, more particularly, to analysis by discrete-time filtering.

2. Description of the Prior Art

In many applications of spectral analysis, it is necessary to detect the presence of a signal in a particular band of frequencies and, particularly for a single tone signal, to estimate the frequency of the tone. This is generally accomplished in conventional analog systems by employing an analog filter bank or a single filter which is swept across the frequencies of interest. Associated with such techniques, however, are the usual problems of analog processors, including unpredictability due to inherent variability of system components, as well as the complexities involved with narrowband low-pass or bandpass filter designs.

In the digital domain, a discrete-time technique for partitioning the given frequency bands into subbands for detection purposes is described in companion references. The first is a letter by V. Cappellini entitled "Digital Filtering With Sampled Signal Spectrum Frequency Shift," published in the *Proceedings of the IEEE*, February, 1969, pages 241 and 242. The other reference is an article by V. Cappellini et al entitled "A Special-Purpose On-Line Processor for Bandpass Analysis," appearing in the *IEEE Transactions on Audio and Electroacoustics*, June, 1970, pages 188–194. The foundational concept disclosed by these references is the ability to achieve narrowband filtering by frequency-domain spectrum shifting (via time domain operations) and decimation to generate resolution capability within the frequency domain. In accordance with the technique of the references, the input signal (bandlimited to $\omega_m$) is sampled at the frequency $2\omega_m$ so as to alias the baseband $-\omega_m$-to-0 signal into the band $\omega_m$ to $2\omega_m$ and the sampled signal is processed in two parallel paths. In one path, the sampled signal is filtered with a time-shared, low-pass filter having an initial cutoff frequency of $\omega_m/2$, thereby developing a signal representation of the input signal's spectrum from 0 to $\omega_m/2$. In the other path, the sampled signal is shifted in frequency by $\omega_m$ by multiplying the elements of the sampled sequence by $(-1)^n$, and the shifted signal is filtered with the same low-pass filter, thereby developing a signal representation of the input signal's spectrum from $\omega_m/2$ to $\omega_m$. In this manner, the digital signals at the output of the two paths are now bandlimited to $\omega_m/2$. By reducing the sampling rate or decimating by a factor of 2, this approach can be reapplied to each of the two developed signals to obtain four signals, with each output signal now representing a different quarter of the spectrum of the input signal. In this fashion, with an increased number of decimation stages and time-sharing of a single digital filter, successively narrower bands can be evaluated. Thus, the main advantage of this decimation approach for partitioning a given frequency band into several subbands is that a single, fixed low-pass digital filter is required; bandpass analysis can be achieved efficiently with a unique digital filter having fixed coefficients at each stage of decimation.

In a variety of applications, it is known that the spectrum of interest contains, at most, a single spectral line since the input signal is a tone. When this a priori condition is known to exist, the method of Cappellini et al possesses inherent disadvantages. First, once the initial set of data samples is extracted from the incoming waveform, only this set, or residuals thereof, is processed by the remaining filter stages. If the particular interval of sampling is affected by noise or spurious signals, these effects propagate throughout the succeeding stages of decimation. Moreover, numerous samples must be taken initially because at each stage of decimation, one-half of the samples are being discarded. Filter edge effects, leading to deleterious results, may occur as the frequency resolution increases if the number of samples retained at each stage does not dominate the filter length. Finally, the necessity of frequency shifting at each stage unduly complicates an already complex system.

SUMMARY OF THE INVENTION

The above disadvantages as well as other shortcomings and limitations are obviated with the present invention of a digital tone detection system utilizing aliasing inherent both in sampling and in expanded filter characteristics whenever only a single tone is present in the input signal. In accordance with this invention, the input signal is sampled at the highest required frequency, $2\omega_m$, and the samples are processed by a discrete-time filter also operating at frequency $2\omega_m$. At the output, a decision as to the presence of a signal in the filter's passband is made. Then, the filter is repetitively expanded by factors of 2 and, after each expansion, a similar decision as to the presence of a signal within the filter's passband is made. The successively unfolding set of decisions regarding the presence of a signal within the filter's passband (when a signal is present) uniquely points to the frequency cell in which the spectral line resides.

DETAILED DESCRIPTION

Figure 1:
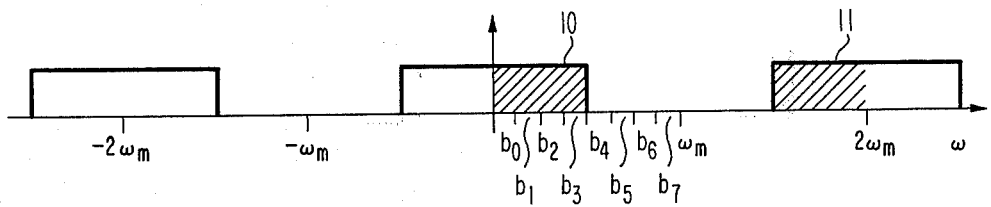
FIGS. 1 through 3 depict the filter frequency response of a discrete-time filter sequentially expanded by factors of 2 and operated at the initial sampling rate $2\omega_m$.

Before describing an illustrative embodiment of the present invention, it is helpful to first consider one theoretical basis for the teachings of the invention. This basis provides additional insight and allows for full elucidation of the subject matter of the invention.

1. Theoretical Basis

In the art of discrete-time filtering, certain classes of filters may be represented by a linear difference equation (LDE) with constant coefficients:

$$y(n) = \sum_{k=0}^{N} a(k)x(n-k) - \sum_{j=1}^{L} b(j)y(n-j), \quad (1)$$

where $\{x(n)\}$ is an input sequence;

{y(n)} is an output sequence;
a(k) and b(j) are fixed, real constants for each k and j, respectively; and
N and L are integers.

The elements x(n) and y(n) are not, in general, limited to a specific set of values, but may have a range defined over the real (or even, complex) numbers. (If the elements are limited to a specific set of values, the filter is then called a digital filter.)

For purposes of the present invention, the input sequence generally arises from sampling a continuous time function x(·). The term "discrete-time" implies that the independent variable, time, is defined for only a discrete set of values. Basically, then, the discrete-time filter of equation (1) linearly transforms one set of sample values or input sequence elements to another set of sample values or output sequence elements.

Again with respect to equation (1), certain other observations are pertinent: (i) y(n) is determined by only past elements of the output sequence so that equation (1) may be solved recursively; on practical grounds, this makes the system realizable in that present output elements do not rely on future output elements; and (ii) y(n) is determined by only present and past input elements so that real-time processing is possible, that is, all necessary processing can be accomplished during the interval between samples.

Two important cases of sampled data filters may be distinguished. The first is the so-called nonrecursive case which is obtained when all b(j) are zero in equation (1) (and, of course, at least one a(k) is not zero). The second is the recursive case which is obtained when at least one b(j) is not zero and at least one a(k) is not zero.

Focusing on the nonrecursive case, as exemplary, equation (1) may be rewritten to yield:

$$y(n) = \sum_{k=0}^{N-1} h(k)x(n-k), \quad (2)$$

where h(k) has been substituted for a(k) and N has been replaced by N-1, that is, the filter is of length N. The set of elements h(k) is the impulse response of the nonrecursive filter and the form of equation (2) demonstrates that any output element is determined by the convolution of the impulse response elements with the input sequence elements.

Often it is advantageous to consider sequences and sequence manipulations from the viewpoint of a transform domain. This is particularly true in the case of a convolutional operation involving sequences since the operation may be converted to multiplication of transforms.

The transform most often utilized when dealing with sequences is the z-transform, where z is a complex variable. For a general sequence {f(n)}, the z-transform is given by $$F(z) = \sum_{n=-\infty}^{\infty} f(n)z^{-n}. \quad (3)$$

In general, the summation converges over a certain region in the z-plane, this region being called the region of convergence (ROC). For sequences having a ROC including the unit circuit in the z-plane (that is, a circle of radius 1 centered at the origin), then the transform may be written as $F(e^{j\omega})$. This obtains by substituting $z=e^{j\omega}$ in equation (2) ($e^{j\omega}$ is the expression for the unit circle in the z-plane); the expression $F(e^{j\omega})$ is called the Fourier Transform of the sequence.

One important property of this Fourier Transform is its periodic nature, that is, the sequence transform repeats in $\omega$-multiples of $2\pi$, presuming the input signal is sampled at a normalized rate of one second. If the input signal is sampled at a rate of $\Delta t$ seconds, then the Fourier Transform repeats in multiples of $2\pi/\Delta t$.

Another property, mentioned earlier, is the conversion of a convolution in the sequence domain to a multiplication in the transform domain; thus, equation (2) may be written as $Y(e^{j\omega})=H(e^{j\omega})X(e^{j\omega})$, where $X(e^{j\omega})$, $Y(e^{j\omega})$ and $H(e^{j\omega})$ are the Fourier Transforms of the input sampled signal, the output sampled signal and the impulse response, respectively. This conversion provides insight since it is generally easier to conceptualize multiplication instead of convolution.

As an example of the further utility of Fourier Transforms, which will also be helpful during later discussion, it is supposed a new sequence {g(n)} is to be formed from {h(n)}. The new sequence has elements defined by $$g(n) = \begin{cases} h\left(\dfrac{n}{2}\right), & n \text{ even} \\ 0, & n \text{ odd.} \end{cases} \quad (4)$$

The new sequence is an "expanded" version of {h(n)}; that is, the old samples are alternately interspersed with zero samples. Thus, for example, if the impulse response of a discrete-time filter requires N elements to define it, the "expanded" response requires 2 N elements to define it, although only N elements are nonzero. In effect, the zeros preserve sample times so that proper sample processing can be effected.

Applying z-transform techniques to equation (4) yields $G(z)=H(z^2)$, or in Fourier Transform terms, $G(e^{j\omega})=H(e^{j2\omega})$. This latter expression points out that $G(e^{j\omega})$ is also periodic, but it has only half the period of $H(e^{j\omega})$. To see this effect pictorially, reference is made to FIGS. 1, 2 and 3. FIG. 1 depicts a particular low-pass, discrete-time filter that is periodic with period $2\omega_m$, $\omega_m$ being a constant. If the impulse response corresponding to the filter of FIG. 1 is "expanded," that is, alternating sequence positions filled with zeros, the low-pass characteristic of FIG. 2 obtains. The response is periodic with period $\omega_m$. It is possible to continue in this manner and "expand" the resulting impulse response characteristic of FIG. 2 so as to yield the Fourier Transform of FIG. 3, which is now of period $\omega_m/2$. If it is presumed the number of samples required to yield the characteristic of FIG. 1 is N elements, then there are 2 N and 4 N elements, respectively, in the impulse responses of FIGS. 2 and 3.

Another property of the sampling operation helpful to the subsequent discussion is that sampling of a continuous time signal at a particular clock rate causes the signal's continuous-time spectrum to appear as sidebands about the clock frequency and all the harmonics of the clock.

2. Illustrative Embodiment

In the illustrative embodiment, the input signal is presumed to have a spectrum bandlimited to $\omega_m$, that is, the frequency to be detected is less than $\omega_m$. To avoid aliasing due to sampling the input signal, the sample rate is $2\omega_m$; this input sampling rate remains constant throughout the processing. As described above, FIGS. 1, 2 and 3 depict the passbands of a particular low-pass filter having its impulse response expanded by factors of 2 and processed at the sampling rate $2\omega_m$. The low-pass filter response shown in FIG. 1 is designed to cover half the frequency band of the input signal. Similarly, the low-pass responses of FIGS. 2 and 3 cover half the frequency bands defined by the respective filter periodicities. Thus, in FIG. 1, shaded areas 10 and 11 cover the frequency bands 0 to $\omega_m/2$ and $3\omega_m/2$ to $2\omega_m$; in FIG. 2, shaded areas 12 and 13 cover the frequency bands 0 to $\omega_m/4$ and $3\omega_m/4$ to $\omega_m$; and in FIG. 3, shaded areas 14 and 15 cover the frequency bands 0 to $\omega_m/8$ and $3\omega_m/8$ to $\omega_m/2$.

Figure 2:
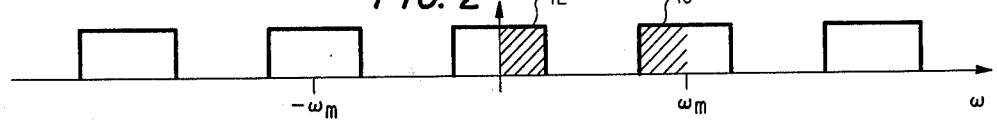
Figure 3:
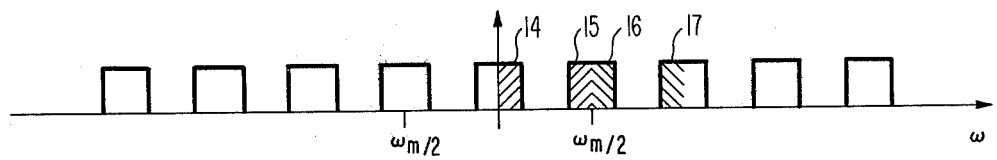

It may also be observed that, within the frequency band 0 to $\omega_m$ (or within any multiple of this band), the total frequency band covered by the low-pass filter responses of the FIGS. 1, 2 and 3 is the same. That is, in FIG. 1 the total band covered is depicted by shaded area 10 and is equal to $\omega_m/2$, in FIG. 2 the total band covered is depicted by shaded areas 12 and 13 and is also equal to $\omega_m/2$, and in FIG. 3 the total band covered is depicted by shaded areas 14, 15, 16 and 17 and is also equal to $\omega_m/2$. The only difference in going from FIG. 1 to FIG. 2 or from FIG. 2 to FIG. 3 is the location of the passbands in the interval 0 to $\omega_m$.

It may further be observed that a signal appearing in any one of the eight bands marked in FIG. 1 by $b_0$ through $b_7$ can uniquely be detected through observance of whether it falls or does not fall in the passbands covered by the filter passband responses of FIGS. 1, 2 and 3. This is shown in the table below where "yes" indicates the presence of the signal within the filter passband and corresponds to a logic "0" for purposes of the "binary designation" column.

| Band | FIG. 1 Filter | FIG. 2 Filter | FIG. 3 Filter | Binary Designation |
|---|---|---|---|---|
| $b_0$ | yes | yes | yes | 0 |
| $b_1$ | yes | yes | no | 1 |
| $b_2$ | yes | no | no | 3 |
| $b_3$ | yes | no | yes | 2 |
| $b_4$ | no | no | yes | 6 |
| $b_5$ | no | no | no | 7 |
| $b_6$ | no | yes | no | 5 |
| $b_7$ | no | yes | yes | 4 |

In view of the above observations, the method of the illustrative embodiment of this invention contemplates the following steps:

(1) sampling an incoming signal that is bandlimited to $\omega_m$ with a sampling clock having the frequency $2\omega_m$;

(2) filtering the sampled signal with a low-pass filter unit that is sequentially expanded by factors of 2 and processed at sampling rate $2\omega_m$;

(3) at each stage of expansion, testing for and providing a binary indication of the presence of a signal at the output of the filter means; and (4) decoding the collection of the binary indications to indicate the frequency band in which the incoming signal resides.

The decoding (step 4) may be implemented in a variety of ways. For example, the collection of binary indications may be combined to form a binary word, such as in the "binary designation" column of the table above, and the binary word may be decoded by way of a look-up table. Alternatively, the filter output signal decisions, and the corresponding binary indications, may be decoded in real-time to obtain the desired frequency measure. The real-time decoding algorithm is as follows: every binary "1" indication toggles a binary flag which, in one of its two states, dictates reversal of subsequent binary indications bits. Thus, a yes-yes-yes sequence of decisions (or 000) decodes to 000, indicating $b_0$; a yes-no-no sequence of decisions (or 011) decodes to 010, indicating $b_2$; and a no-no-no sequence of decisions (or 111) decodes to 101, indicating $b_5$, and so forth.

Figure 4:
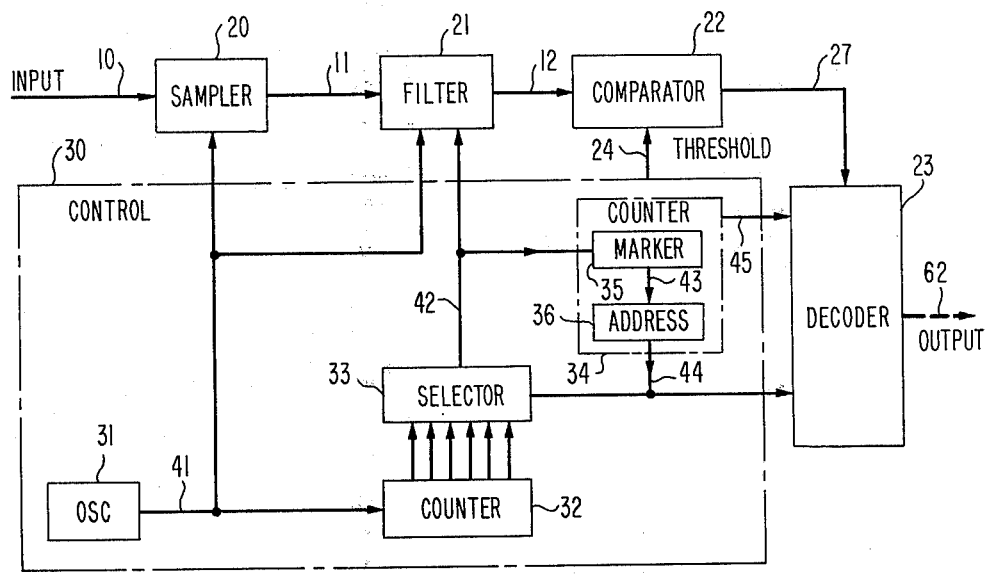
FIG. 4 depicts an illustrative embodiment of a frequency detection circuit employing the principles of this invention.

The apparatus for implementing the method of this invention may take on a variety of forms. For illustrative purposes, FIG. 4 depicts a realization employing a single discrete-time filter unit 21 which is time-shared. In FIG. 4, the input signal on lead 10 is applied to sampler 20, of standard design, and the sampled signal is applied, via lead 11, to low-pass filter unit 21 having a low-pass characteristic equal to half the period of a band. Such a passband response is illustrated in FIG. 1 for the initial sampling frequency of $2\omega_m$. The output signal of filter 21 is applied, via lead 12, to comparator 22 which compares, for example, the peak value or the energy of the filter's output signal to a threshold signal on lead 24 which is indicative of the anticipated signal strength. The result of the comparison, digitized to a binary "1" or "0," is clocked on lead 27 into decoder 23 which develops the frequency-indicating output signal.

Elements 21 and 22 deal with discrete-time but these signals need not be processed in amplitude-discrete form. In fact, amplitude-continuous technology (e.g., using CCD shift registers) may yield a simpler realization. Therefore, for purposes of this disclosure, amplitude-continuous operation is described although it is understood that amplitude-discrete operation is equally applicable. The output signal of comparator 22, on the other hand, is binary in nature. Therefore, decoder 23 is implemented most conveniently with conventional digital circuitry.

Thus, filter unit 21 may comprise a standard non-recursive low-pass filter using CCD registers, and comparator 22 may comprise conventional peak detector means and a comparator-amplifier to which the threshold voltage of lead 24 is applied. The structure of decoder 23, although quite conventional, is described below.

Sampler 20, low-pass filter unit 21, comparator 22 and decoder 23 are all responsive to control element 30 which comprises oscillator 31. Master oscillator 31 operates at frequency $2\omega_m$, where $\omega_m$ is the highest frequency expected at the input of sampler 20, and the output signal of oscillator 31, which appears on lead 41, controls both filter unit 21 and sampler 20 to effect sampling of the input signal at frequency $2\omega_m$. In accordance with the principles of this invention, filter unit 21 weights the input signal with the original and repetitively expanded versions of the frequency characteristic exemplified by FIGS. 1 through 3. Since the filter characteristic of FIGS. 1 through 3 appear to arise from successive division of the $2\omega_m$ clock by factors of 2 (corresponding to expanding the frequency characteristic by factors of 2), it is convenient to speak in terms of clock signals $2\omega_m$, $\omega_m$, $\omega_m/2$, etc., that accompany expansion. To provide filter 21 with the sequential application of the signals equivalent to successively divided clock signals, control 30 comprises counter 32, responsive to oscillator 31, and selector 33, responsive to the output signals of counter 32. Counter 32 is a binary counter and the various output signals of counter 32 are related in frequency to the output signal of oscillator 31 by powers of 2. Selector 33 selects one of the submultiple clocks developed by counter 32 and applies the selected clock signal to filter unit 21 via lead 42. Additionally, selector 33 applies the selected clock signal, within control element 30, to counter 34. Counter 34 comprises two sections: marker 35 partitions off a preselected number of clock pulses out of selector 33; and address section 36, being responsive to the output signal of marker 35 via lead 43, develops the address signals for selector 33 on lead 44. In this manner of operation, the number of clock pulses at the output of selector 33 at each clock frequency is the same, regardless of the clock frequency developed by selector 33 and applied to filter unit 21. Lead 44 is also applied to decoder 23. In decoder 23 the signal on lead 44 is used to capture the comparison results of element 22 just prior to the change in the expansion factor of filter 21. The comparison result of element 22 is strobed with the clock of lead 44, into flip-flop 50 (see FIG. 6) within decoder 23. The threshold signal on lead 24 may be fixed or may be changed by control element 30. When the number of clock pulses which process the input signal to filter 21 at any particular frequency is the same for all frequencies, the theshold signal of lead 24 may be constant and, therefore, fixed.

When all of the desired filter characteristics have been applied by low-pass filter unit 21, decoder 23 contains the full complement, or set, of test results that uniquely determines the frequency at which the input signal resides. At that time, the output signal of decoder 23 represents the desired frequency indication and should be provided to the user. Accordingly, counter 34 has a second output signal, on lead 45, which strobes the output signal of decoder 23 and provides it to the user on bus 62.

Figure 5:
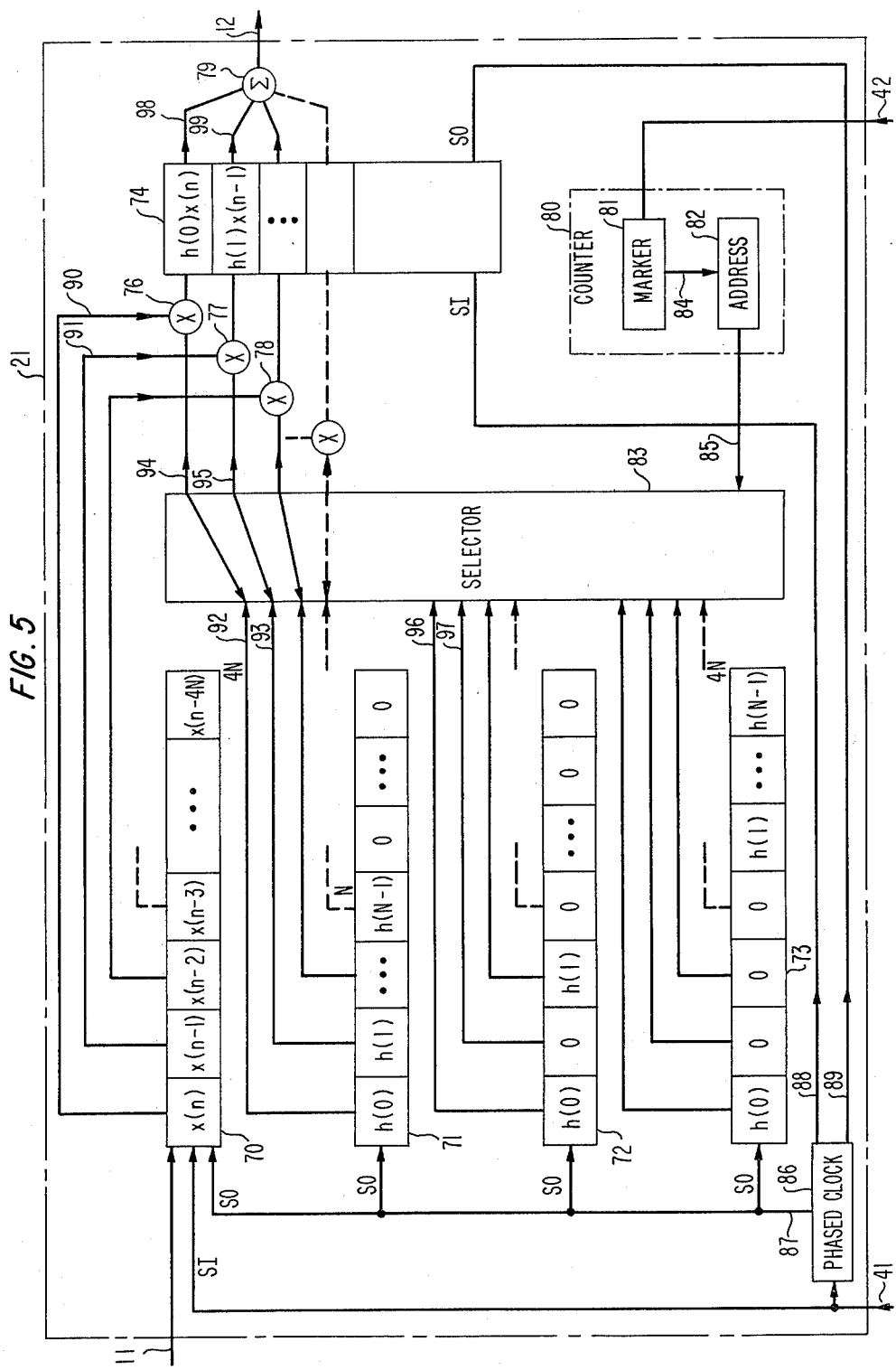
FIG. 5 depicts an illustrative embodiment of filter unit 21 of FIG. 4.

In FIG. 5, one possible form of filter unit 21 is depicted. Serial-in - parallel-out storage device 70 stores samples arriving on lead 11 from sampler 20. As described in the discussion on the theoretical basis and in correspondence with FIGS. 1 through 3, device 70 is of length 4 N, where N is the length of the impulse response of filter unit 21. (If three stages of expansion are employed, then the length is 8 N, and so forth.) Parallel-out, read-only devices 71, 72 and 73 store the impulse response coefficients corresponding to the filter characteristics as shown in FIGS. 1, 2 and 3, respectively. For instance, the coefficients stored in device 72 are the expanded version of those stored in 71. Devices 71 through 73 have a total of 3 N zeros. In device 71 all zeros are in the last 3 N storage positions; in device 72 the first 2 N positions have zeros in every other storage location and the last 2 N positions are all zeros; finally, device 73 has impulse response coefficients in every fourth location and zeros elsewhere.

Samples in device 70 are routed to multipliers 76, 77, 78, . . . via leads 90, 91, . . . , respectively, as part of the processing to form the summed series of equation (2). The other input to each multiplier is provided via selector 83, which routes the samples in either device 71, 72 or 73, depending on the clock submultiple arriving on lead 42. The appropriate samples are provided on leads 94, 95, . . . to multipliers 76, 77, . . . , respectively.

Selector 83 is switched in response to counter 80, which comprises substantially the same elements as counter 34 (see FIG. 4). Selector 83 is initially set to route the samples from device 71 to selector 83 output leads 94, 95, . . . during the highest clocking rate ($2\omega_m$).

Marker 81 partitions off a preselected number of clock pulses out of selector 33 (see FIG. 4) arriving on lead 42, and address section 82, responsive to marker 81 on lead 84, develops the address signal for selector 83 on lead 85. During the submultiple clock characterized by frequency $\omega_m$, samples from device 72 are routed to multipliers 76, 77, 78, . . . , and during clocking at frequency $\omega_m/2$, device 73 is connected through selector 83.

The results of the individual multiplications are stored in the parallel-in - parallel-out device 74 during a shift-in operation. The summation required by equation (2) is completed during a shift-out operation on device 74. The individual products are delivered on leads 98, 99, . . . , and are summed in element 79. The filtered signal from filter unit 21 is provided on lead 12 and represents y(n) of equation (2). The values shown stored in device 74 yield the y(n) value associated with the highest clock rate ($2\omega_m$). Phased clock 86 derives, from oscillator 81, the required gating and shifting signals that allow for proper transmission and sequencing of signals internal to filter 21. For example, a two-phased clock comprising oscillator signal 31 and an identical version delayed by $\frac{1}{4}$ the period is sufficient to provide all required clocking signals. A sample on lead 11 is shifted into device 70 on the leading edge of oscillator 31. The leading edge of the submultiple clock on lead 42 corresponds to the leading edge of oscillator 31 and the submultiple clock causes selector 83 to switch after the proper number of pulses have been counted. The leading edge of the delayed clock shifts out, via lead 87, devices 70 through 73. The trailing edge of oscillator 31 signals a shift-in operation to device 74 via lead 88. Finally, the trailing edge of the delayed clock, via lead 89, signals a shift-out operation to summer 79. The element y(n) is then present on lead 12 for comparison before the start of the next clock period of oscillator 31. As discussed earlier, once the convolution of the input with the impulse response is complete, the resultant comparison is made in comparator 22 and gated to decoder 23 via lead 27.

Figure 6:
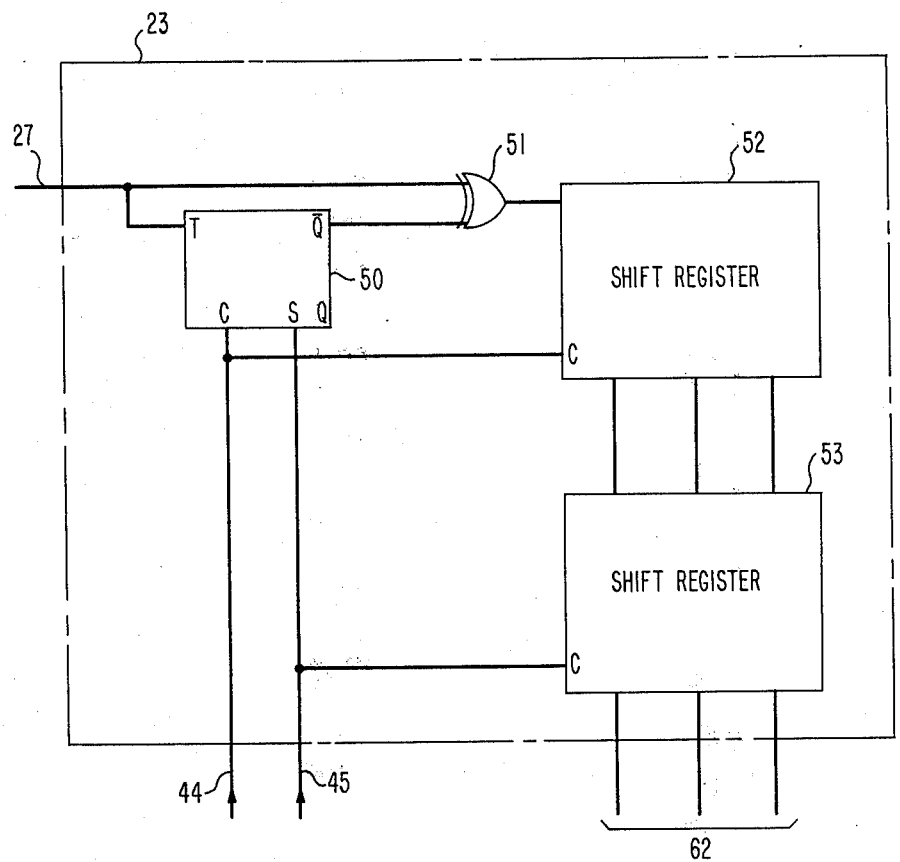
FIG. 6 depicts an illustrative embodiment of decoder 23 of FIG. 4.

In FIG. 6, decoder 23 is implemented in accordance with the real-time decoding method described above. Toggle flip-flop 50 is responsive to the input signal on lead 27, and exclusive OR gate 51 is responsive to the input signal on lead 27 and to the $\overline{Q}$ output of flip-flop 50. The output signal of gate 51 is applied to serial-in - parallel-out shift register 52 and the parallel-out signal of register 52 is applied to parallel-in - parallel-out register 53. Flip-flop 50 and shift register 52 are clocked with the signal of lead 44. Flip-flop 50 is "set" and register 53 is strobed with the signal of lead 45.

Thus, when a new clock frequency is applied to filter 21, flip-flop 50 is "set" causing $\overline{Q}$ to be at "0," and all input signals to decoder 23 are passed through gate 51 unaltered. Element 22 continually compares the output signal of filter 21, but the comparison is utilized only when the clock signal on lead 44 makes the appropriate transition (e.g., from 0 to 1). At that time, the output signal of gate 51 is shifted into register 52 and flip-flop 50 is clocked. If the output signal of comparator 22 is a logic "1," after the logic "1" is shifted into gate 52 the $\overline{Q}$ output of flip-flop 50 toggles to a "1" and all subsequent input signals to gate 51, until after the next occurrence of a logic "1" to detector 23, are inverted in gate 51 as they are shifted into register 52. When the set of binary indications is fully stored in register 52, the parallel output signals of register 52 provide an indication of the narrow frequency band within which the input signal to the apparatus of FIG. 4 resides. This frequency indication is strobed into register 53 with the clock signal of lead 45, thereby providing to the user the desired frequency indication via bus 62.

Although the illustrative embodiment presented has set forth separate coefficient memories to store expanded versions of the filter characteristics, it is clear that only one memory of length N is required. The coefficients could be selectively supplied to selector 83 at each stage of expansion to effect the desired convolution, which always processes, at most, N nonzero multiplications. Moreover, whereas a plurality of multiplications occur simultaneously within devices 76, 77, 78, . . . , similar processing could be obtained on a serial basis with high-speed circulators and a single accumulator (adder). Thus, it is to be further understood that the single tone detector, and associated methodology, described herein is not limited to specific forms disclosed by way of example and illustration, but may assume other embodiments limited only by the scope of the appended claims.

I claim:

1. Circuitry for detecting and estimating the frequency of a discretized input tone
characterized by
discrete-time means (21,30), including a discrete-time filter (21) having operating states represented by an initial frequency characteristic and expanded frequency characteristics derived from said initial characteristic, for receiving and processing said discretized tone by expanding said filter to operate sequentially in each of said states to produce a corresponding sequence of outputs; and
means (22,23), coupled to said discrete-time means, for identifying said input tone from said sequence of outputs.

2. Apparatus for determining the frequency of an input tone
characterized by
means (20) for receiving and sampling said tone to derive a sequence of discrete-time samples;
digital means (21,30), responsive to said means for sampling and including a digital filter (21) having a set of expanded frequency domain characteristics, for processing said sequence by sequentially expanding said filter and filtering said sequence with each characteristic in said set to produce a series of outputs; and
means (22,23), coupled to said digital means, for identifying said input tone from said outputs.

3. The circuitry as recited in claim 2 wherein said digital filter exhibits a low-pass filter characteristic and said set is obtained by expanding said low-pass characteristic in factors of 2.

4. A frequency measuring circuit responsive to an input signal
characterized by
means (20), responsive to said input signal, for sampling said input signal with a clock signal;
discrete-time, bandpass filter means (21) responsive to said means for sampling;
decision means (22), responsive to said filter means, for detecting a significant output level from said filter means; and
means (30), coupled to said means for sampling and said filter means, for developing a set of expansion signals to sequentially drive said filter means, said set corresponding to said clock and preselected, consecutive submultiples of said clock.

5. A detector for partitioning the frequency spectrum of an incoming signal into frequency bands
characterized by
sampling means (20), responsive to said incoming signal, for generating discrete-time samples representing said incoming signal;
discrete-time filter means (21), coupled to said sampling means, for processing said samples and producing an output signal;
control means (30) including an oscillator (31), coupled to said sampling means and said filter means, for driving said sampling means with said oscillator and for generating a set of duration-limited clocking signals to sequentially expand said filter means, said set comprising the frequency of said oscillator and preselected submultiples of said oscillator;
threshold signal means (24), connected to said control means, for generating a reference signal;
means (22), coupled to said threshold means and said filter means, for comparing said output of said filter during said duration of each of said clocking signals with said reference signal; and
means (23), responsive to said means for comparing, for decoding the resultant sequence of outputs from said means for comparing.

6. A detector for estimating the frequency of an input tone
characterized by
control means (30) including an oscillator (31) operating at a fixed rate;
means (20), responsive to said oscillator, for sampling said input tone at said fixed rate;
first means (70), coupled to said means for sampling, for storing a plurality of samples generated by said means for sampling;
second means (71–73) for storing coefficient arrays representative of a low-pass filter and expanded versions thereof;
switch means (83), connected to said second means, having a plurality of positions for selecting a set of coefficients from said arrays;
digital filter means (74,76–79), responsive to said switch means and said first means, for convolving at said fixed rate said set of samples with said set of coefficients to form a sampled output signal;
means (22), coupled to said filter means, for comparing the peak value of said output signal to a predetermined threshold (24);
counter means (80), responsive to said control means, for selecting successive states of said switch means in response to a predetermined number of said samples; and
means (23), connected to said means for comparing, for decoding successive outputs from said means for comparing to indicate the estimate to said frequency.

7. Circuitry for estimating the frequency of a variable-tone signal
characterized by
a sampler (20), responsive to said tone signal, to discretize said tone signal at a rate of a least twice the highest expected tone frequency;
discrete-time filter means (21), coupled to said sampler, for processing the output of said sampler;
control means (30) comprising an oscillator (31), connected to said sampler, for driving said sampler at said rate;

a first counter (32), responsive to said oscillator, having a plurality of clock outputs including a clock at said rate and clocks representing said oscillator repetitively divided by two;

a selector (33), responsive to said first counter, for selecting one of said plurality of clock outputs to drive said filter means; and a second counter (34), responsive to said selector, including a marker (35) to count a predetermined number of clock pulses from said selector, and address means (36), responsive to said marker, to sequentially step said selector to the next lowest clock at the completion of the count of said marker;

means (24), coupled to said control means, for generating a threshold signal indicative of the strength of said tone input;

means (22), responsive to said discrete-time means and said means for generating, for comparing the output of said filter means with said threshold signal to provide a resultant comparison signal; and a decoder (23), responsive to said comparing means and said control means, for converting each said resultant signal generated during each said plurality of clock signals to produce an output signal representative of said frequency.

8. Circuitry as recited in claim 7 wherein said filter means includes a low-pass filter having a cutoff of one-half said highest expected frequency of said tone signal.

9. A method for estimating the frequency of a tone signal comprising the steps of:

(i) sampling said tone at a rate of at least twice the highest expected tone frequency to produce a sampled signal;

(ii) providing a reference signal and discrete-time filter means with an initial frequency characteristic defined over a band determined by said rate;

(iii) filtering, at said rate, said sampled signal with said filter means to produce an output signal;

(iv) comparing said output signal to said reference signal to produce an indicator signal;

(v) determining if said filter means is to be expanded and, if so, expanding said filter means by a factor of two and proceeding to step (iii); otherwise, continuing with step (vi); and (vi) generating a series of estimator signals by grouping each said indicator signal produced upon repetition of step (iv).

10. The method as recited in claim 9 further comprising the step of decoding said series of estimator signals to estimate the frequency of said tone signal.

* * * * *

UNITED STATES PATENT AND TRADEMARK OFFICE
CERTIFICATE OF CORRECTION

PATENT NO. : 4,326,261

DATED : April 20, 1982

INVENTOR(S) : John T. Peoples

It is certified that error appears in the above—identified patent and that said Letters Patent is hereby corrected as shown below:

On the Title page after "Inventor" insert

-- [73] Assignee: Western Electric Company, Incorporated, New York, N.Y. --.

Signed and Sealed this

Twenty-fourth Day of August 1982

|SEAL|

Attest:

GERALD J. MOSSINGHOFF

Attesting Officer — Commissioner of Patents and Trademarks